(12) United States Patent
Jeon et al.

(10) Patent No.: US 6,911,815 B2
(45) Date of Patent: Jun. 28, 2005

(54) SEMICONDUCTOR TEST SYSTEM AND METHOD OF OPERATING THE SAME

(75) Inventors: Taek-Joon Jeon, Cheonan (KR); Jae-Hong Yun, Yongin (KR); In-Cheol Kim, Cheonan (KR); Duk-Soon Choi, Asan (KR)

(73) Assignee: Samsung Electronics Co. Ltd, Suwon (KR)

( * ) Notice: Subject to any disclaimer, the term of this patent is extended or adjusted under 35 U.S.C. 154(b) by 68 days.

(21) Appl. No.: 10/644,727

(22) Filed: Aug. 21, 2003

(65) Prior Publication Data

US 2004/0119462 A1 Jun. 24, 2004

(30) Foreign Application Priority Data

Dec. 20, 2002 (KR) .................................. 10-2002-0081740

(51) Int. Cl.⁷ ............................ G01R 1/04; G01R 31/26
(52) U.S. Cl. ...................................... 324/158.1; 324/765
(58) Field of Search ............................... 324/158.1, 765, 324/73.1; 414/724–725, 416, 404

(56) References Cited

U.S. PATENT DOCUMENTS 4,044,244 A * 8/1977 Foreman et al. ............ 714/724
4,271,515 A * 6/1981 Axtell et al. ................ 714/736
5,828,223 A * 10/1998 Rabkin et al. ............... 324/754
5,973,571 A * 10/1999 Suzuki ........................ 331/17
6,057,679 A * 5/2000 Slizynski et al. ........ 324/158.1
6,163,145 A * 12/2000 Yamada et al. .......... 324/158.1

FOREIGN PATENT DOCUMENTS

| JP | 9061491 | 3/1997 |
| JP | 2001349927 | 12/2001 |
| KR | 1995-37825 | 10/1995 |
| KR | 1996-061594 | 12/1996 |

* cited by examiner

Primary Examiner—Michael Tokar
Assistant Examiner—Jermele Hollington
(74) Attorney, Agent, or Firm—Harness, Dickey & Pierce, PLC

(57) ABSTRACT

A semiconductor test system and method for the same. A handler is capable of moving and classifying semiconductor packages, a logic tester is capable of receiving a semiconductor package from the handler, and for testing a logic component of the semiconductor package. An analog tester may be coupled to the logic tester, where the analog tester is capable of testing an analog component of the semiconductor package. An interface unit may be included for selectively outputting a logic signal to enable the analog tester.

28 Claims, 7 Drawing Sheets

SEMICONDUCTOR TEST SYSTEM AND METHOD OF OPERATING THE SAME

This application claims the priority of Korean Patent Application No. 2002-81740, filed on Dec. 20, 2002, in the Korean Intellectual Property Office, the disclosure of which is incorporated herein in its entirety by reference.

BACKGROUND OF THE INVENTION

1. Field of the Invention

The present invention generally relates to semiconductor test systems and methods of operating the same. More specifically, the present invention generally relates to a semiconductor test system, by which a semiconductor package, in which an analog component and a logic component are integrated, may be tested without additional purchase of an costly mix tester, and a method of operating the same.

2. Description of the Related Art

In general, after semiconductor devices are assembled as a semiconductor package, the functionality thereof is electrically tested before being made available to end users. This is normally called a "test process," which is performed using a tester and a handler.

Such a tester, in which a waveform generator, a current/voltage generator, and a current/voltage measurer are mounted, tests an electrical functionality of a semiconductor device. The tester may use a integrated test program to test the electrical functionality of the semiconductor device. Moreover, the tester may be divided into an analog tester that tests an analog package, a logic tester that tests a logic package, and a mix tester that tests a semiconductor package in which an analog component and a logic component are integrated.

The handler, which may be considered as a type of robot, may assist in the automatic processing during the test process of the electrical functionality of a semiconductor package. That is, the handler may be an automated apparatus, which loads semiconductor packages into/out of the tester, and further classifies the semiconductor packages based on test results. Typically, only one handler is installed in each tester.

In recent years, the increased use of semiconductor devices, in which a logic component and an analog component are integrated, has lead to a strong need for a mix tester. However, since mix testers are normally very expensive, purchasing of a mix tester may significantly increase manufacturing costs associated with the production of semiconductor devices.

Furthermore, while demand for and use of mix testers are increasing, an analog tester and a logic tester, which can test only one of an analog package and a logic package, are becoming substantially obsolete.

SUMMARY OF THE INVENTION

An exemplary embodiment of the present invention may provide a semiconductor test system. The semiconductor test system is capable of testing a semiconductor package that includes integrated analog and logic components, without an additional procurement of a high-priced mix tester.

Additionally, an exemplary embodiment of the present invention may provide a method of testing a semiconductor package that includes integrated analog and logic components, without the use of a high-priced mix tester.

In accordance with an exemplary embodiment of the present invention, there is provided a semiconductor test system that includes a handler for moving and classifying semiconductor packages, a logic tester for receiving a semiconductor package from the handler, and for testing a logic component of the semiconductor package, an analog tester coupled to the logic tester, the analog tester for testing an analog component of the semiconductor package, and an interface unit for selectively outputting a logic signal to enable the analog tester.

In accordance with another exemplary embodiment of the present invention, there is provided a semiconductor test system that includes a handler for moving and classifying semiconductor packages, a logic tester having a test board for receiving a semiconductor package from the handler, the test board mounted on a side wall of the logic tester facing the handler, the logic tester for testing a logic component of the semiconductor package mounted on the test board, an analog tester coupled to the test board, the analog tester for testing an analog component of the semiconductor package that is decided as operationally functional during the logic test, and an interface unit for selectively outputting a logic signal during the analog test.

In accordance with yet another exemplary embodiment of the present invention, a method of operating a semiconductor test system is provided that includes mounting a semiconductor package on a board of a logic tester, testing a logic component of the semiconductor package with the logic tester, and if the logic component of the semiconductor package is determined operationally functional, testing an analog component of the semiconductor package with an analog tester.

In accordance with yet another exemplary embodiment of the present invention, a semiconductor testing device includes a first testing unit for testing at least a section of a semiconductor device, and an second testing unit for testing at least another section of the semiconductor device, the second testing unit testing the at least another section of the semiconductor device if the first testing unit determines the at least a section is operationally functional.

In accordance with another exemplary embodiment of the present invention, a method includes testing an analog component of a semiconductor device if it is determined a logic component of the semiconductor device is operationally functional.

Further scope of applicability of the present invention will become apparent from the detailed description given hereinafter. However, it should be understood that the detailed description and specific examples, while indicating exemplary embodiments of the present invention, are given by way of illustration only, since various changes and modifications within the spirit and scope of the invention will become apparent to those skilled in the art from this detailed description.

BRIEF DESCRIPTION OF THE DRAWINGS

Features and advantages of the present invention will become more apparent by describing in detail exemplary embodiments thereof with reference to the attached drawings in which.

DETAILED DESCRIPTION OF THE EXEMPLARY EMBODIMENTS

Figure 1:
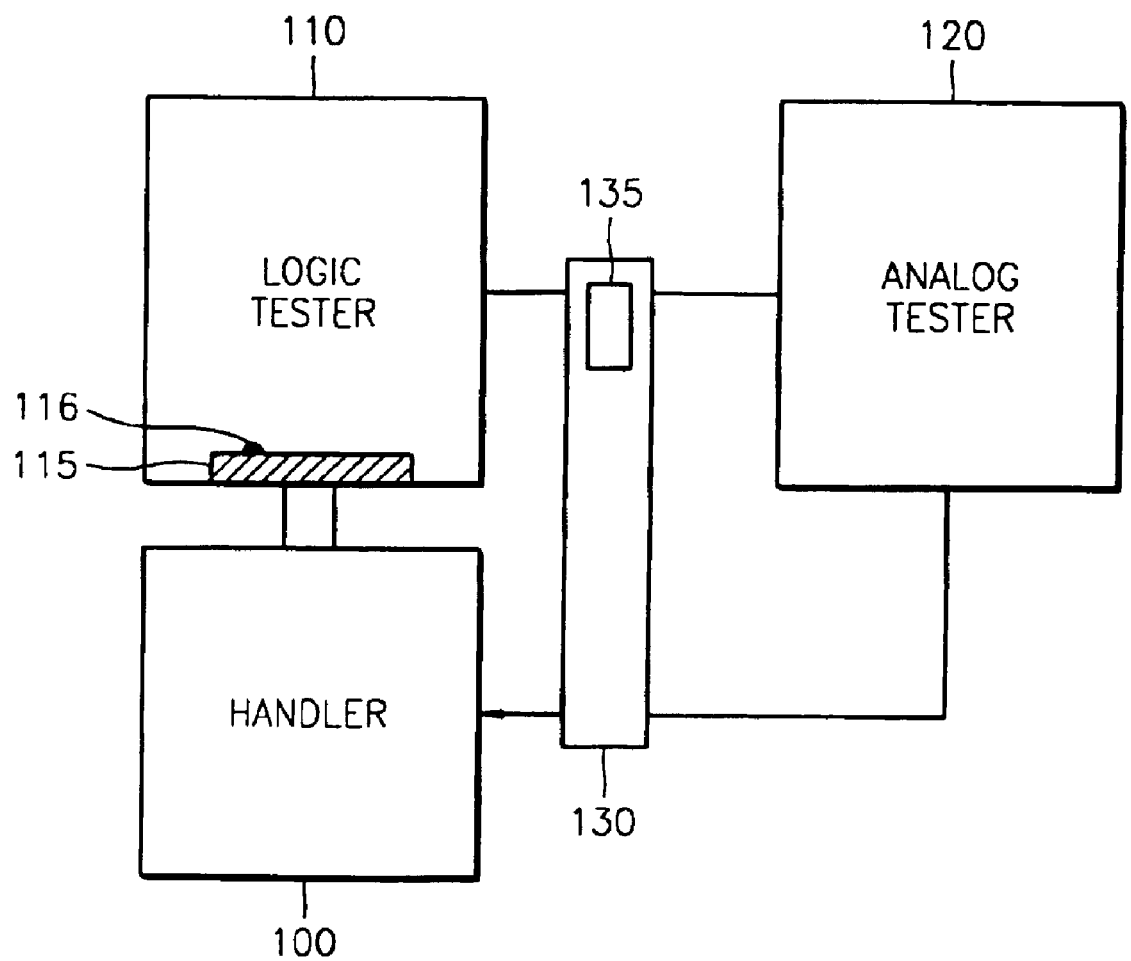
FIG. 1 is a block diagram of a semiconductor test system according to an exemplary embodiment of the present invention.

Exemplary embodiments of the present invention will now be described more fully with reference to the accompanying drawings. The present invention may, however, be embodied in many different forms and should not be construed as being limited to the exemplary embodiments set forth herein. In the drawings, the shape of elements is exaggerated for clarity, and the same reference numerals in different drawings represent the same element.

As illustrated in FIG. 1, a test system of an exemplary embodiment of the present invention may include a handler 100, a logic tester 110, an analog tester 120, and an interface unit 130.

The handler 100 may be used to load/unload a semiconductor package to be tested into/out of the testers 110 and 120 and classify the semiconductor package as a good unit or a defective. Also, the handler 100 may transmit signals that operate or stop the logic tester 110 and the analog tester 120 in order to control operations of the logic tester 110 and the analog tester 120. According to one exemplary embodiment of the present invention, the two testers 110 and 120 may be controlled using a single handler 100 so as to simplify the configuration of a manufacturing apparatus. Also, a handler of a typical logic tester 110 may be used as the handler 100.

The logic tester 110 is capable of testing whether or not a logic component of the semiconductor package, transferred from the handler 100, is normally formed. The logic tester 110 may include a test board 115 where the semiconductor package can be mounted. According to an exemplary embodiment of the present invention, the test board 115 may include not only logic component terminals but also analog component terminals.

Figure 2:
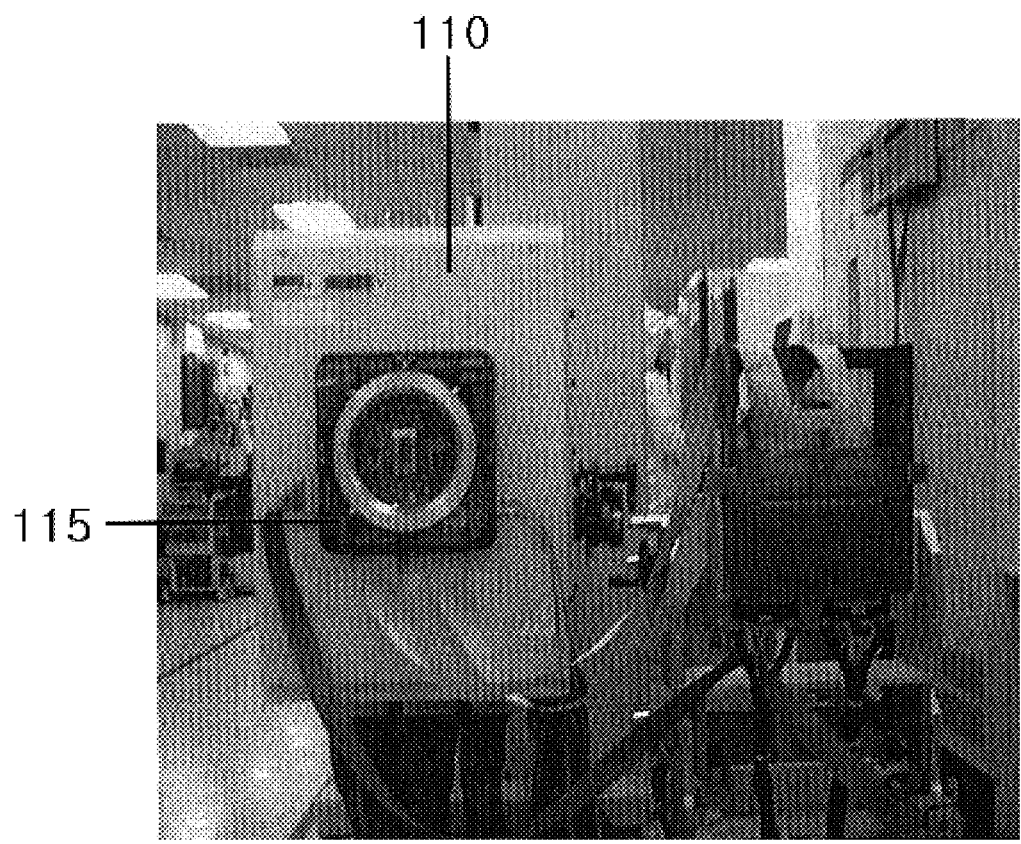
FIG. 2 is a photograph of a test board mounted on a logic tester, according to an exemplary embodiment of the present invention.

FIG. 2 is a photograph of the test board 115 mounted on one sidewall of the logic tester 110. The test board 115 is illustrated as being installed on the sidewall of the logic tester 110, facing the handler 100.

Figure 3A:
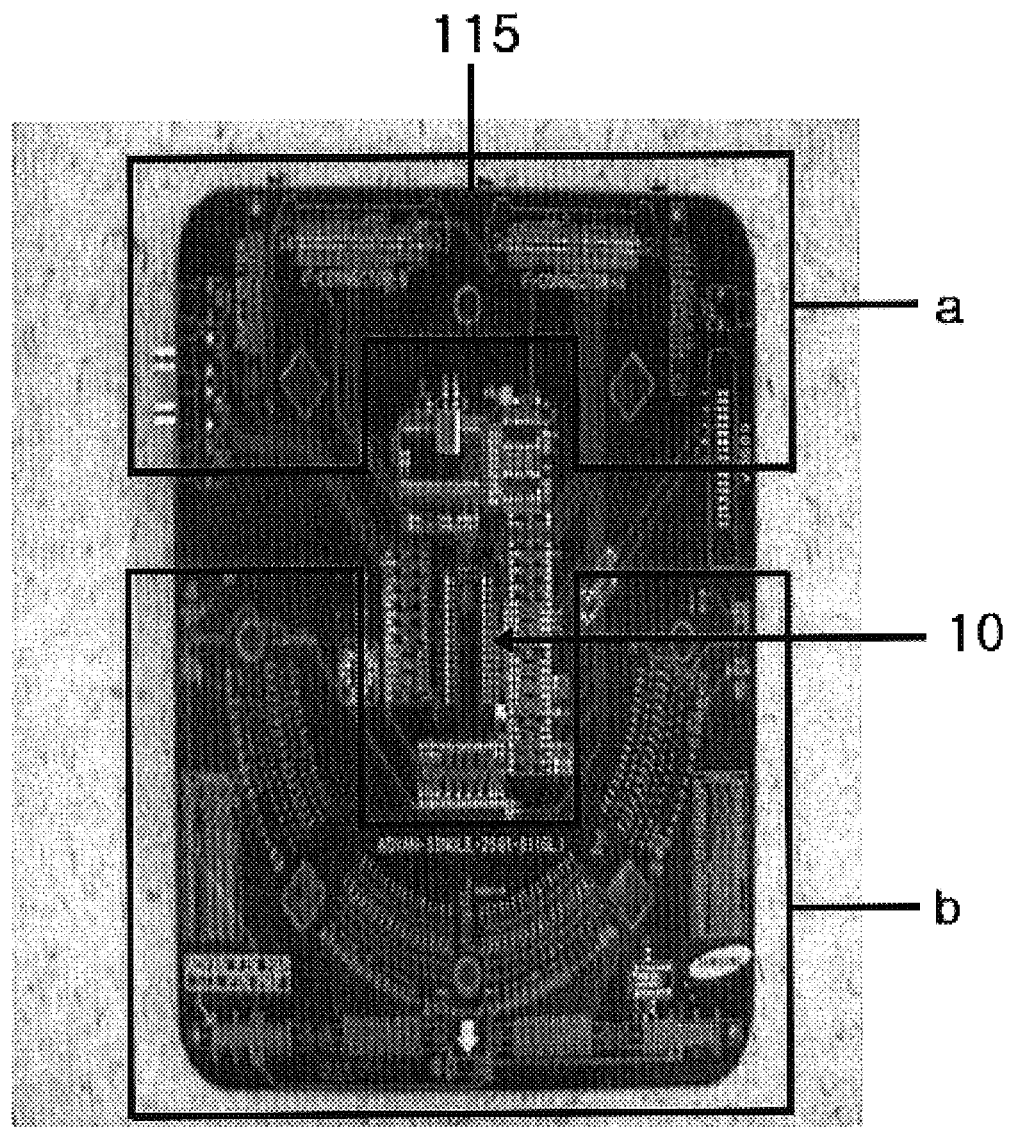
FIGS. 3A and 3B are photographs of the test board according to an exemplary embodiment of the present invention.

FIG. 3A is a photograph showing the front of the test board 115 according to an exemplary embodiment of the present invention. While the analog terminals a may be disposed at an upper portion of the front (one side) of the test board 115, the logic terminal b may be disposed at a lower portion of the front of the test board 115. Also, the semiconductor package 10 may be mounted in the center of the test board 115, between the analog terminal a and the logic terminal b. The analog terminals a are electrically connected to the analog tester 120, and the logic terminal b is electrically connected to the logic tester 110.

Figure 3B:
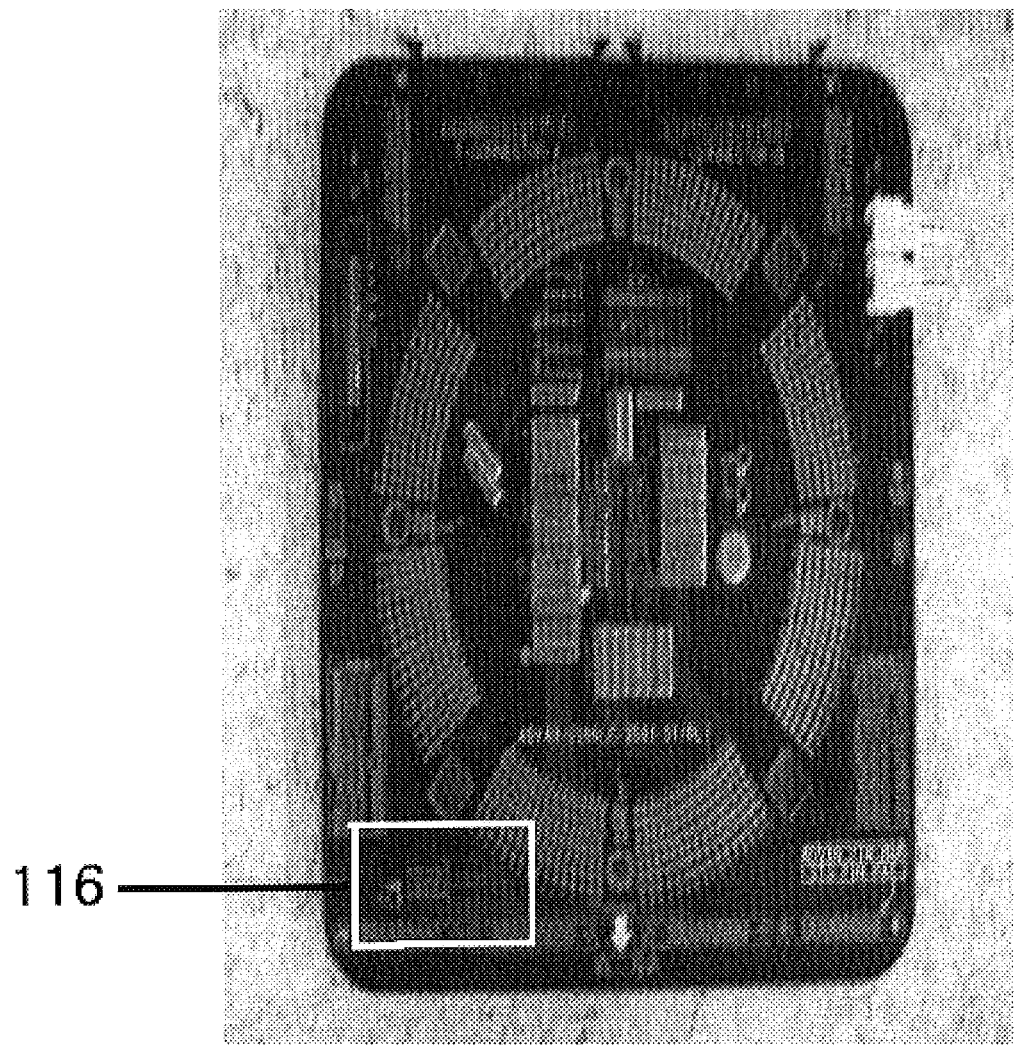

FIG. 3B is a photograph showing the back (the other side) of the test board 115, according to an exemplary embodiment of the present invention. As illustrated in FIG. 3B, a storage unit 116 may be installed on the back of the test board 115. The storage unit 116 is capable of storing results from the logic tester 110 of the semiconductor package 10.

Figure 4:
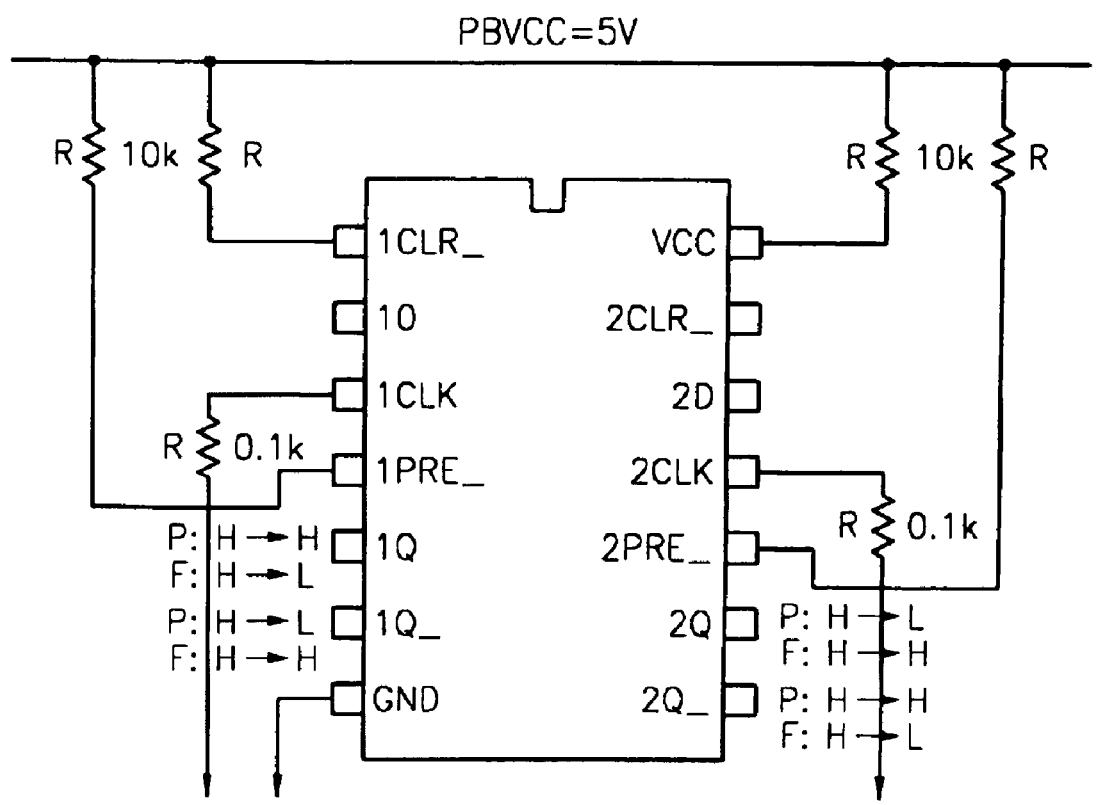
FIG. 4 is a circuit diagram of a latch unit installed on a test board in order to store logic test results according to an exemplary embodiment of the present invention.

The storage unit 116, which may store the results of the logic tester 110, is a latch device, such as 75LS74 (D-flip flop), as illustrated in FIG. 4. According to an exemplary embodiment of the present invention, the latch device may operate in the following manner. When a "low (L)" signal (0 to 0.5V) is read out from an output 1Q of the latch device, this will indicate the semiconductor package is likely operating in a normal manner. However, when a "high (H)" signal (4 to 4.5V) is read out from the output 1Q of the latch device, the semiconductor package is likely defective (See FIG. 4). A resistance R of the latch device is provided to maintain logic test results associated with a given semiconductor package.

The analog tester 120, which is connected to the logic tester 110 by a connector (not shown), is capable of testing whether the analog component of the semiconductor package 10 is normally formed. In one exemplary embodiment of the present invention, the connector is coupled to the analog terminal a of the test board 115 mounted on the logic tester 110. The analog tester 120 is operated by an start of test (SOT) signal from the handler 100. The analog tester 120 evaluates the semiconductor package 10 that is indicated in normal operational order by the logic tester 110.

The interface unit 130, which interfaces the logic tester 110 and the analog tester 120, may include a logic signal generating unit 135. The logic signal generating unit 135 outputs a logic signal when the logic and analog tests are simultaneously required. That is, because the logic tester 110 and the analog tester 120 are individually positioned and selectively driven, it is difficult to test an item that needs both the logic test and the analog test. However, if the logic signal is output during the analog test, the logic test and the analog test can be simultaneously performed. Therefore, according to an exemplary embodiment of the present invention, the logic signal generating unit 135 may be installed at the interface unit 130 so as to output the logic signal during the analog test.

In one exemplary embodiment of the present invention, the logic signal generating unit 135 may include a multipoint control unit (MCU) application. The application may control an output of data for testing by way of an I/O control function and an interrupt function. Therefore, the MCU application may be useful in setting the device to a particular mode. In one instance, that mode may be a desired logic level or condition. The MCU application is capable of using a particular set of ports. For example, the MCU application may use a data output pin (P1), a mode select pin (P0) and an interrupt input pin (P2). An input signal for mode selection and interruption in the MCU may be received by the device, which in one exemplary embodiment is the analog tester 120. In such a case, for each generated interruption, data selected by the set mode is applied to the analog tester 120 to ensure it is prepared for testing. In particular, control of the analog tester 120 is achieved.

Figure 5:
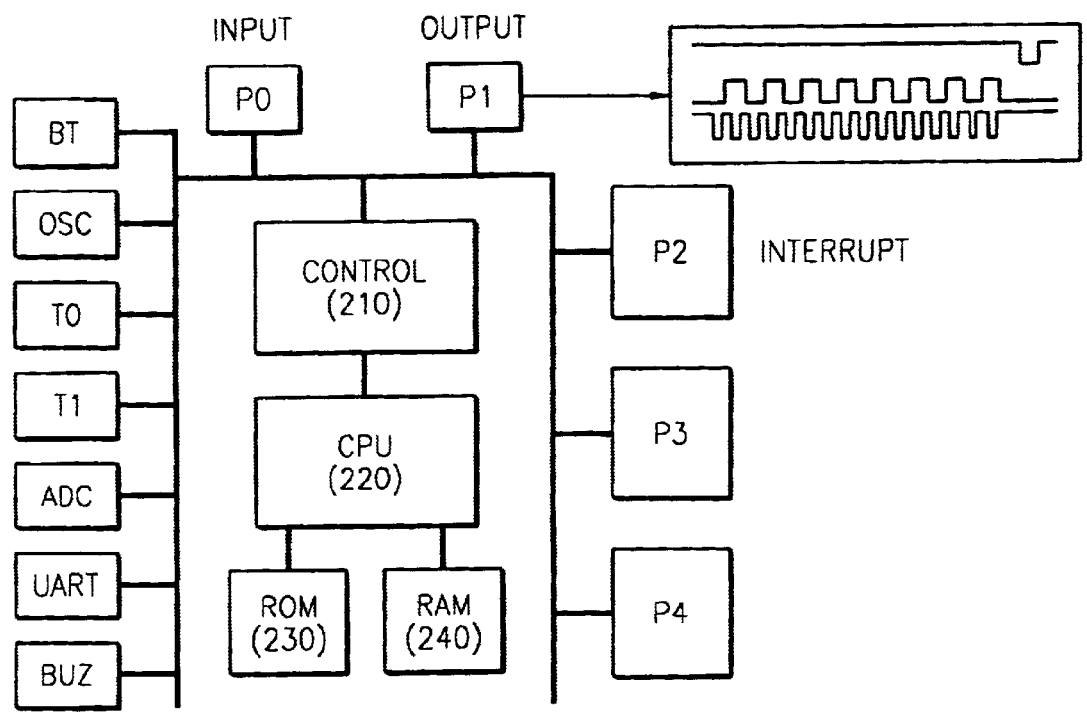
FIG. 5 is a block diagram of a logic signal generating unit according to an exemplary embodiment of the present invention.

As illustrated in FIG. 5, the logic signal generating unit 135 may be, for example, a MCU, which includes a control block 210, a central processing unit 220, a ROM 230, a RAM 240, and a plurality of pins P0-P4, BT, OCS, T0, T1, ADC, UART, and BUZ.

Figure 6:
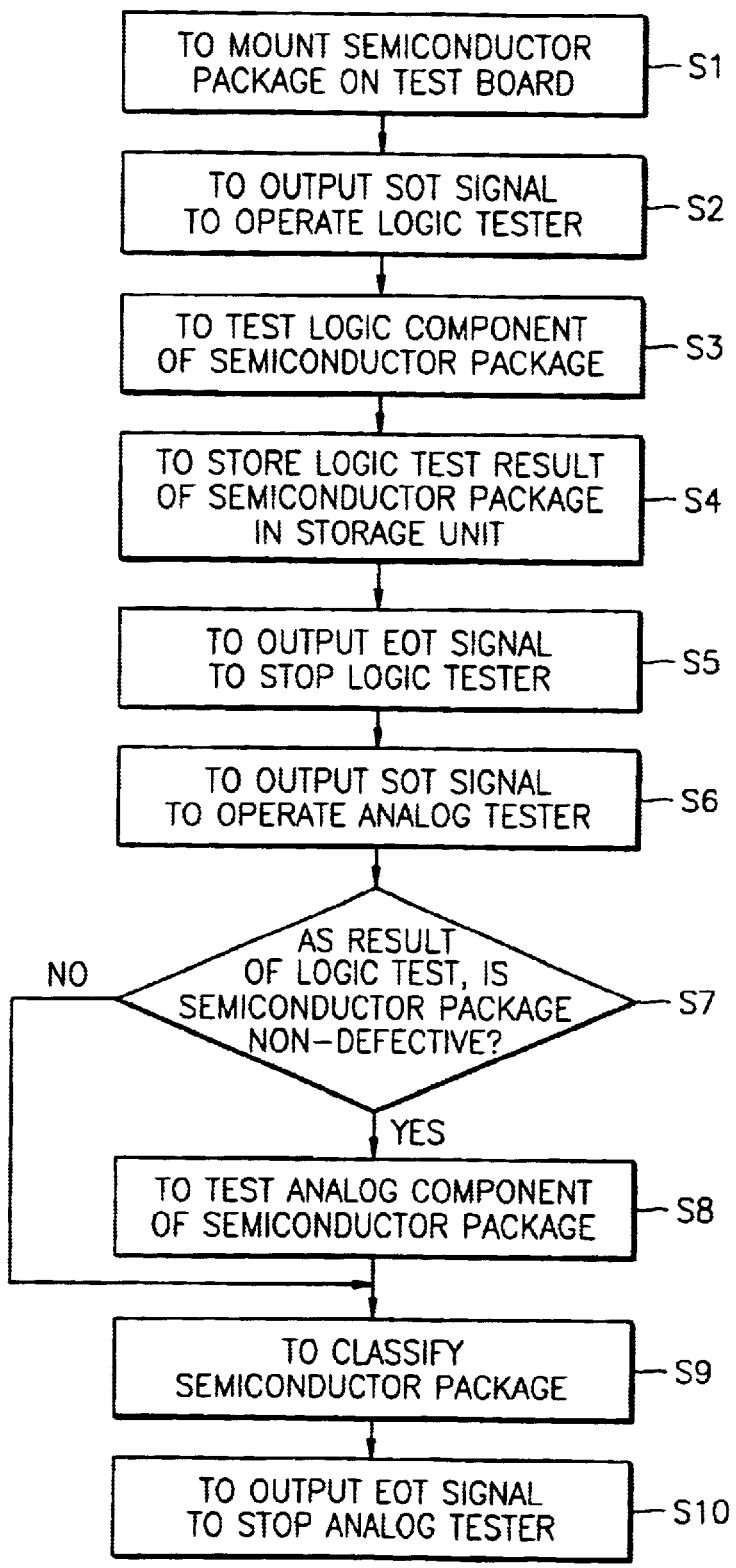
FIG. 6 is a flowchart illustrating operations of a semiconductor test system according to an exemplary embodiment of the present invention.

A method of operating a semiconductor test system according to an exemplary embodiment of the present invention will be described hereinafter with reference to FIG. 6.

A semiconductor package 10 to be tested may be mounted on the test board 115 by the handler 100 (S1). Here, the semiconductor package 10 may include both the logic component and the analog component. The handler 100 may output a start of test (SOT) signal (S2) so as to operate the logic tester 110. The logic component of the semiconductor package 10 mounted on the test board 115 may be tested once the SOT signal is output (S3). When the logic test is completed, a test result as to whether or not the logic component of the semiconductor package 10 is in operational order may be stored in the storage unit 116, which is installed on the test board 115 (S4). The handler 100 outputs an end of test (EOT) signal (S5) in order to turn off the logic tester 110.

The handler 100 may output an SOT signal so as to operate the analog tester 120 (S6). However, before the analog component of the semiconductor package 10 is tested, the storage unit 116 may be accessed to determine whether or not the logic component of the semiconductor package 10 is in operational order (S7). As described, if the output 1Q of the storage unit 116 is a low signal, the logic component is likely in good operational order. Thus, the analog component of the semiconductor package 10 may be tested (S8), and the handler will classify the semiconductor package 10 as a satisfactory or unsatisfactory unit, based on the analog test result (S9). Otherwise, if the output 1Q of the storage unit 166 is a high signal, the logic component is likely defective. Thus, without having to process the analog test, the semiconductor package may be directly classified as a defective unit (S9). Thus, the handler 100 may output an EOT signal so as to turn off the analog tester 120. When the logic signal is required during the analog test, the signal may be output from the logic signal generating unit 135.

According to an exemplary embodiment of the present invention, a logic tester and an analog tester may be integrated in a single handler, and an interface unit for outputting a logic signal may be installed between the logic tester and the analog tester. Thus, a semiconductor package, having integrated logic and analog components, may be easily tested, and the configuration of a test system may be simplified by the use of one handler.

In addition, when both the logic test and the analog test are required, a interface unit may output a logic signal to initiate an analog testing sequence. Accordingly, the logic and analog tests may be simultaneously performed using separate logic and analog testing routines.

Because an additional mix tester is normally not required as a result of the operational characteristics of the exemplary embodiments of the present invention, the manufacturing costs of the semiconductor devices may be significantly reduced.

Although the exemplary embodiments of the present invention have been illustrated and discussed in conjunction with particular hardware elements, this has been done by way of illustration only. In particular, the exemplary embodiments of the present invention may be realized in software, or a combination of both software and hardware.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor test system, comprising:
   a handler for moving and classifying semiconductor packages;
   a logic tester for receiving a semiconductor package from the handler, and for testing a logic component of the semiconductor package;
   an analog tester coupled to the logic tester, the analog tester for testing an analog component of the semiconductor package; and
   an interface unit for selectively outputting a logic signal to enable the analog tester.

2. The system as claimed in claim 1, wherein the handler faces a sidewall of the logic tester, the handler further for controlling operation and stoppage of the logic tester and the analog tester.

3. The system as claimed in claim 1, further comprising a test board installed on a sidewall of the logic tester, between the handler and the logic tester, the test board being positioned on the sidewall of the logic tester in a vicinity of the semiconductor package received from the handler.

4. The system as claimed in claim 3, wherein the test board includes a logic terminal for connecting to the logic component of the semiconductor package and an analog terminal for connecting to the analog component of the semiconductor package.

5. The system as claimed in claim 4, wherein the analog tester is electrically coupled to the analog terminal of the test board.

6. The system as claimed in claim 3, further comprising a storage unit for storing test results of the logic tester.

7. The system as claimed in claim 6, wherein the storage unit is a latch circuit.

8. The system as claimed in claim 1, wherein the interface unit further includes a logic signal generating unit for selectively outputting a logic signal during the analog test.

9. The system as claimed in claim 8, wherein the logic signal generating unit is a multi-point control unit.

10. A semiconductor test system, comprising:
    a handler for moving and classifying semiconductor packages;
    a logic tester having a test board for receiving a semiconductor package from the handler, the test board mounted on a side wall of the logic tester facing the handler, the logic tester for testing a logic component of the semiconductor package mounted on the test board;
    an analog tester coupled to the test board, the analog tester for testing an analog component of the semiconductor package that is decided as operationally functional during the logic test; and
    an interface unit for selectively outputting a logic signal during the analog test.

11. The system as claimed in claim 10, wherein the handler outputs start of test signals and end of test signals to the logic tester and the analog tester.

12. The system as claimed in claim 10, wherein the test board includes a logic terminal for connecting to the logic component of the semiconductor package and an analog terminal for connecting to the analog component of the semiconductor package.

13. The system as claimed in claim 12, wherein the analog tester is electrically coupled to the analog terminal of the test board.

14. The system as claimed in claim 12, further comprising a storage unit for storing test results of the logic tester.

15. The system as claimed in claim 14, wherein the storage unit is a latch circuit.

16. The system as claimed in claim 10, wherein the interface unit further includes a logic signal generating unit for selectively outputting a logic signal during the analog test.

17. A method of operating a semiconductor test system, comprising:

mounting a semiconductor package on a board of a logic tester;

testing a logic component of the semiconductor package with the logic tester; and if the logic component of the semiconductor package is determined operationally functional, testing an analog component of the semiconductor package with an analog tester.

18. The method according to claim 17, further comprising classifying the semiconductor package as faulty if the logic component is determined operationally defective.

19. The method according to claim 17, further comprising classifying the semiconductor package as a operationally functional unit if both the logic and analog component tests determine the components are operationally functional.

20. The method as claimed in claim 17, wherein testing the analog component of the semiconductor package occurs while a logic signal is generated by a logic generating unit.

21. A semiconductor testing device, comprising:

a first testing unit for testing at least a section of a semiconductor device; and an second testing unit for testing at least another section of the semiconductor device, the second testing unit testing the at least another section of the semiconductor device if the first testing unit determines the at least a section is operationally functional.

22. The semiconductor testing device according to claim 21, wherein the first testing unit tests a logic section of the semiconductor device.

23. The semiconductor testing device according to claim 22, wherein the second testing unit is capable of testing an analog section of the semiconductor device.

24. The semiconductor testing device according to claim 21, further comprising an interface device for selectively enabling the second testing unit.

25. A method, comprising:

testing an analog component of a semiconductor device if it is determined a logic component of the semiconductor device is operationally functional.

26. The method according to claim 25, further comprising classifying the semiconductor device as defective if the logic component of the semiconductor device is not operationally functional.

27. The method according to claim 25, further comprising testing the logic component of the semiconductor device.

28. The method according to claim 23, further comprising producing a logic signal to enable testing the analog component of the semiconductor device.

* * * * *